United States Patent
Morooka

(10) Patent No.: US 8,125,757 B2
(45) Date of Patent: Feb. 28, 2012

(54) WAFER SUPPORT DEVICE AND COMPONENT USED FOR THE SAME

(75) Inventor: Ikuma Morooka, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 444 days.

(21) Appl. No.: 12/479,948

(22) Filed: Jun. 8, 2009

(65) Prior Publication Data

US 2010/0002355 A1 Jan. 7, 2010

Related U.S. Application Data

(60) Provisional application No. 61/077,602, filed on Jul. 2, 2008.

(51) Int. Cl.
*H01T 23/00* (2006.01)
(52) U.S. Cl. .......................................... 361/234
(58) Field of Classification Search .................... 361/234
See application file for complete search history.

(56) References Cited

U.S. PATENT DOCUMENTS

| | | | |
|---|---|---|---|
| 5,491,603 A * | 2/1996 | Birang et al. | 361/234 |
| 5,958,265 A * | 9/1999 | Ogahara | 219/121.43 |
| 6,373,681 B2 * | 4/2002 | Kanno et al. | 361/234 |
| 6,853,533 B2 * | 2/2005 | Parkhe | 361/234 |
| 2004/0261946 A1 | 12/2004 | Endoh et al. | |

FOREIGN PATENT DOCUMENTS

JP 2005-064460 A1 3/2005

* cited by examiner

*Primary Examiner* — Stephen W Jackson
(74) *Attorney, Agent, or Firm* — Burr & Brown

(57) ABSTRACT

A wafer support device 20 includes an electrostatic chuck 22 provided to attract a silicon wafer W as an object of plasma processing, a protection ring 30 mounted on a step 26 of the electrostatic chuck 22, a cooling plate 40 placed on a rear face of the electrostatic chuck 22 to cool down the electrostatic chuck 22, and a coolant gas flow path 50 arranged to supply a flow of a coolant gas for cooling down the protection ring 30. The protection ring 30 has a skirt 34 arranged to cover over a side face of the electrostatic chuck 22. The coolant gas flow path 50 is formed to make the coolant gas flow from a rear face of the cooling plate 40 through an outer circumferential area 48 of an adhesive sheet 47 to be spread over and collide against a whole circumference on an inner wall of the skirt 34 of the protection ring 30.

6 Claims, 9 Drawing Sheets

WAFER SUPPORT DEVICE AND COMPONENT USED FOR THE SAME

BACKGROUND OF THE INVENTION

1. Field of the Invention

The present invention relates to a wafer support device and a component used for the wafer support device.

2. Description of the Related Art

Plasma CVD apparatuses, plasma etching apparatuses, and plasma ashing apparatuses are known examples of plasma processing apparatuses. In these plasma processing apparatuses, a wafer support device is generally used to place a wafer in a vacuum chamber. The wafer support device includes an electrostatic chuck provided to attract and fasten a wafer as an object of plasma processing and a cooling plate arranged to cool dozen the electrostatic chuck. The electrostatic chuck has an internal electrode embedded in an insulating material or a dielectric material (for example, a ceramic material). In the wafer support device, the wafer is placed on a wafer mount surface of the electrostatic chuck, and a direct-current voltage is applied to the internal electrode to generate an electrostatic force (Coulomb force or Johnson-Rahbek force) and thereby attract and fasten the wafer onto the wafer mount surface. In this state, the wafer is exposed to plasma, which is generated by application of a high-frequency voltage between an upper electrode located in the vacuum chamber and the internal electrode embedded in the electrostatic chuck or between the upper electrode and the cooling plate.

The generated plasma is used for processing the wafer but may also erode an area close to the wafer. When the wafer mount surface of the electrostatic chuck is greater in dimensions than the wafer, a marginal area of the wafer mount surface outside the wafer is directly exposed to the plasma and may thus be eroded. One measure against this potential problem makes the wafer mount surface of the electrostatic chuck smaller in dimensions than the wafer, forms a step lower than the wafer mount surface around the outer circumference of the wafer mount surface of the electrostatic chuck, and places a replaceable protection ring on the step. The protection ring works to stably expose the outer circumferential edge of the wafer to the plasma and protect the surface of the electrostatic chuck. The diameter of the wafer is greater than the diameter of the wafer mount surface of the electrostatic chuck. A top surface of the protection ring is formed to have a height lower than the wafer so that the outer circumferential edge of the wafer is accordingly protruded from the wafer mount surface. The outer circumferential edge of the wafer is not in contact with but is slightly away from the protection ring. During plasma processing of the wafer, the protection ring is naturally exposed to the plasma and has a temperature increase. In a wafer support device 220 of Patent Document 1 shown in FIG. 8, a coolant gas flow path 250 is provided to prevent an excessive temperature increase of a protection ring 230. The coolant gas flow path 250 is formed to pass through a step 26 of an electrostatic chuck 22 in a vertical direction. A flow of coolant gas (helium gas) is supplied through the coolant gas flow path 250 to cool down the protection ring 230. The electrostatic chuck 22 is cooled down by a cooling plate 40.

Patent Document 1: Japanese Patent Laid-Open No. 2005-64460

SUMMARY OF THE INVENTION

In the wafer support device 220 of the cited Patent Document 1, a specific area of the protection ring 230 directly exposed to the flow of the coolant gas is sufficiently cooled down, while an area away from the specific area is not sufficiently cooled down, and thus whole protection ring is not cooled down uniformly. Namely the protection ring 230 is not sufficiently cooled down as a whole. The insufficient cooling of the protection ring 230 undesirably accelerates erosion of the protection ring 230. Another problem of the prior art structure is a lift-up of the protection ring 230 by the collision of the coolant gas flowed upward through the coolant gas flow path 250. The lifting-up protection ring 230 may collided with a wafer W attracted and fastened on a wafer mount surface 24 of the electrostatic chuck 22 to generate particles. The positional deviation of the lifting-up protection ring 230 from its fixed position may also cause problems, such as a damage of the protection ring 230 by interference with another component and a change of temperature distribution. The specific area of the protection ring 230 directly exposed to the flow of the coolant gas may have a burn, which may be ascribed to arcing in the coolant gas flow path 250. The arcing undesirably generates particles and damages the protection ring 230.

By taking into account the drawbacks discussed above, in a wafer support device and a component used for the wafer support device, there would be a demand for sufficiently cooling down a protection ring while preventing lift-up and damage of the protection ring.

The present invention accomplishes at least part of the demand mentioned above and the other relevant demands by the following configurations applied to the wafer support device and the component used for the wafer support device.

One aspect of the invention is directed to a wafer support device including: an electrostatic chuck structured to have a wafer mount surface that a wafer is placed on and an internal electrode and configured to make the wafer attract onto the wafer mount surface under application of a direct-current voltage to the internal electrode; a step formed around an outer circumference of the wafer mount surface in the electrostatic chuck to have a height lower than the wafer mount surface; a protection ring mounted on the step and structured to have a skirt covering over a side face of the electrostatic chuck; and a coolant gas flow path formed to make a coolant gas spread over from a side of the electrostatic chuck and collide against a whole circumference on an inner wall of the skirt of the protection ring.

In the wafer support device according to this aspect of the invention, the coolant gas is supplied through the coolant gas flow path during plasma processing on the wafer attracted onto the wafer mount surface of the electrostatic chuck. The flow of the coolant gas is then spread over from a side of the electrostatic chuck and collides against the whole circumference on the inner wall of the skirt of the protection ring. The skirt of the protection ring covers over the side face of the electrostatic chuck. The flow of the coolant gas against the skirt of the protection ring generates substantially no force in a direction of lifting up the protection ring from the step. The spread of the coolant gas over the whole circumference of the skirt substantially uniformly cools down the whole protection ring and has little potential for arcing, compared with the concentrated stream of the coolant gas at one specific location. The wafer support device of this arrangement enables the protection ring to be sufficiently cooled down, while effectively preventing lift-up and damage of the protection ring.

The wafer support device according to this aspect of the invention may further has: a cooling plate joined with a face of the electrostatic chuck opposite to the wafer mount surface across an adhesive layer and provided to cool down the electrostatic chuck. In the wafer support device, the coolant gas flow path may be formed to make the coolant gas spread over from inside of the cooling plate and collide against the whole circumference on the inner wall of the skirt of the protection ring via an outer circumferential area of the adhesive layer in a space between the cooling plate and the electrostatic chuck. The coolant gas flow path does not need to be formed inside the electrostatic chuck. This arrangement ensures relatively easy production of the wafer support device. This arrangement is advantageous especially when the electrostatic chuck is a ceramic component and the cooling plate is made of metal.

In the wafer support device having the cooling plate according to one aspect of the invention, the coolant gas flow path may be formed to make the coolant gas flow from the inside of the cooling plate through a gas induction pathway formed inside the adhesive layer to the outer circumferential area of the adhesive layer to be spread over from the outer circumferential area of the adhesive layer and collide against the whole circumference on the inner wall of the skirt of the protection ring. Generally, a resin adhesive layer or polymer adhesive layer has high workability. This arrangement thus ensures easy production of a gas induction pathway.

Another aspect of the invention is directed to a component used for a wafer support device including: an electrostatic chuck structured to have a wafer mount surface that a wafer is placed on and an internal electrode and configured to make the wafer attract onto the wafer mount surface under application of a direct-current voltage to the internal electrode; a step formed around an outer circumference of the wafer mount surface in the electrostatic chuck to have a height lower than the wafer mount surface and designed to place thereon a protection ring with a skirt covering over a side face of the electrostatic chuck; and a coolant gas flow path formed to make a coolant gas spread over from a side of the electrostatic chuck and collide against a whole circumference on an inner wall of the skirt of the protection ring.

In this aspect of the invention, the component used for a wafer support device may be used in combination with the protection ring with the skirt covering over side face of the electrostatic chuck to be the above-mentioned wafer support device. This arrangement thus sufficiently cools down the protection ring while effectively preventing the lift-up and damage of the protection ring.

The component used for a wafer support device according to this aspect of the invention may further has: a cooling plate joined with a face of the electrostatic chuck opposite to the wafer mount surface across an adhesive layer and provided to cool down the electrostatic chuck. In the component used for a wafer support device, the coolant gas flow path may be formed to make the coolant gas spread over from inside of the cooling plate and collide against the whole circumference on the inner wall of the skirt of the protection ring via an outer circumferential area of the adhesive layer in a space between the cooling plate and the electrostatic chuck. The coolant gas flow path does not need to be formed inside the electrostatic chuck. This arrangement ensures relatively easy production of the wafer support device. This arrangement is advantageous especially when the electrostatic chuck is a ceramic component and the cooling plate is made of metal.

In the component used for a wafer support device having the cooling plate according to another aspect of the invention, the coolant gas flow path may be formed to make the coolant gas flow from the inside of the cooling plate through a gas induction pathway formed inside the adhesive layer to the outer circumferential area of the adhesive layer to be spread over from the outer circumferential area of the adhesive layer and collide against the whole circumference on the inner wall of the skirt of the protection ring. Generally, a resin adhesive layer or polymer adhesive layer has high workability. This arrangement thus ensures easy production of a gas induction pathway.

DESCRIPTION OF THE PREFERRED EMBODIMENTS

First Embodiment

Figure 1:
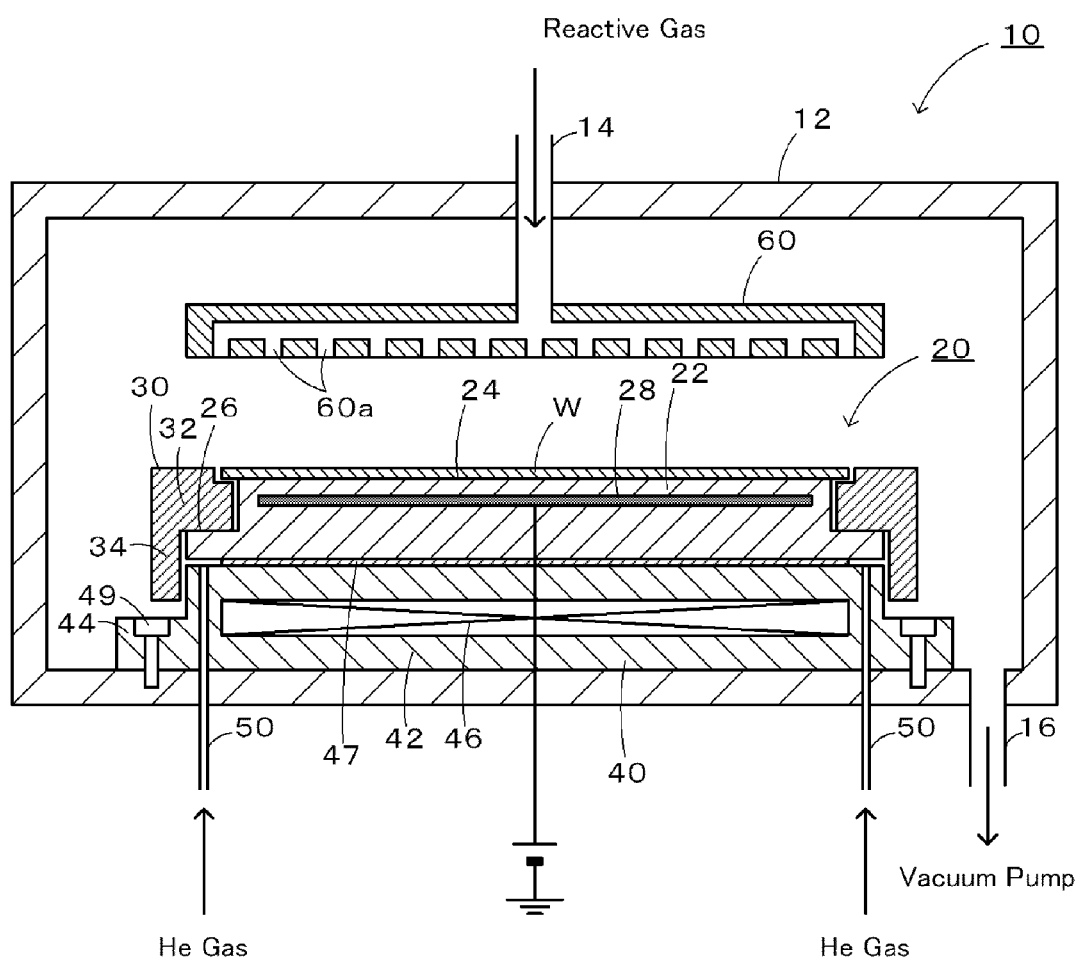
FIG. 1 is a sectional view schematically showing the configuration of a plasma processing apparatus 10 including a wafer support device 20.
Figure 2:
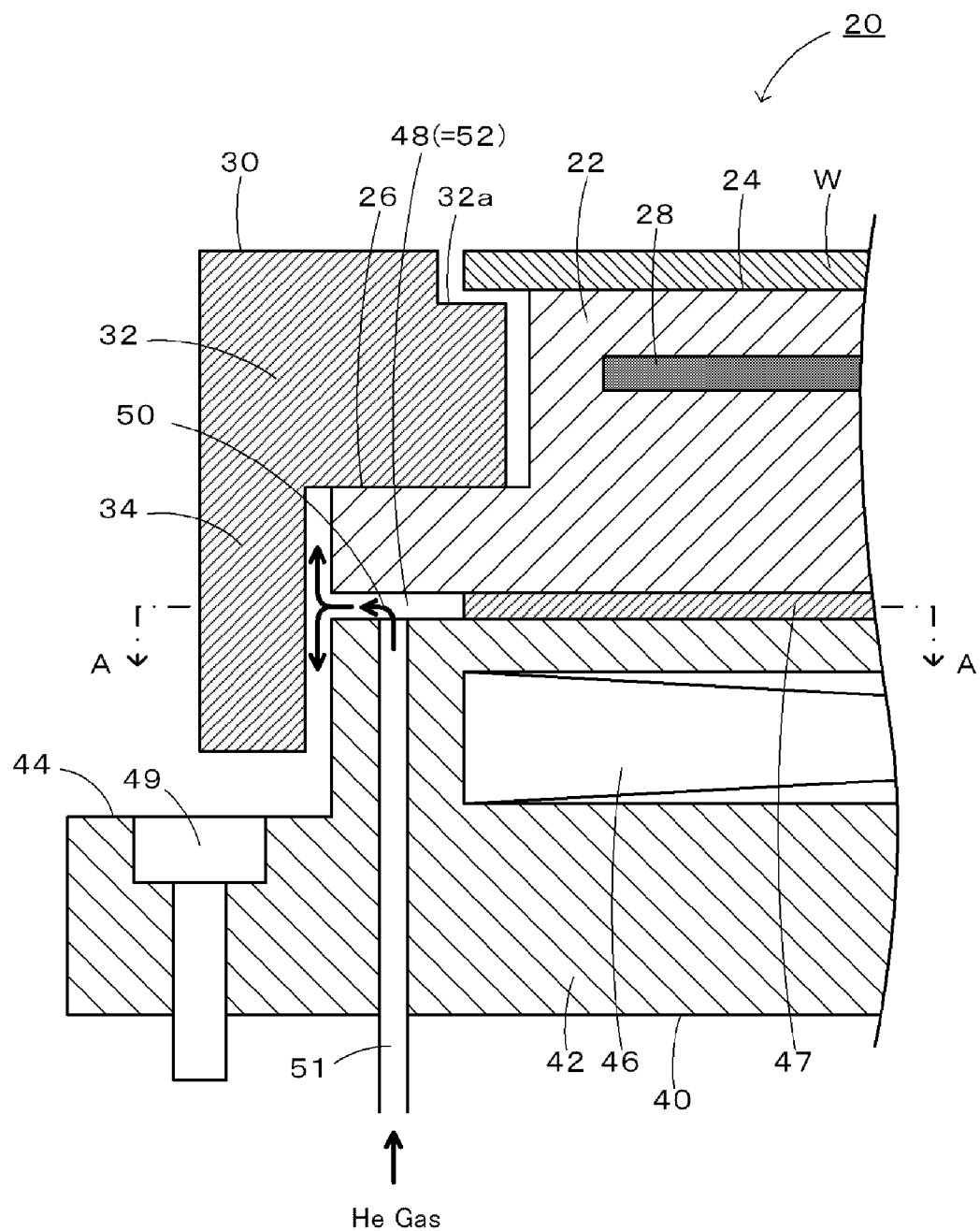
FIG. 2 is a partial sectional view of the wafer support device 20.
Figure 3:
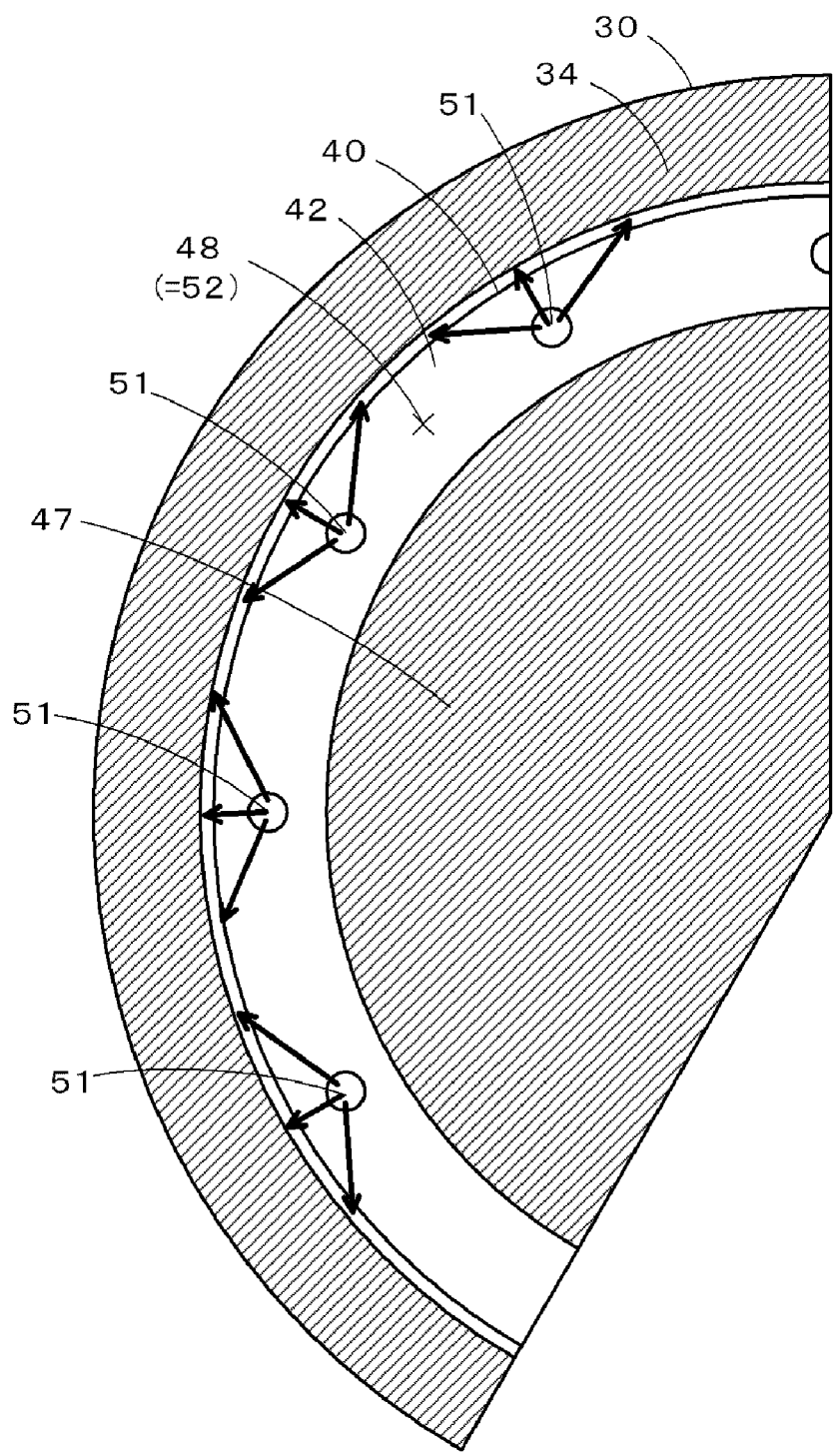
FIG. 3 is a sectional view of the wafer support device 20, taken on the line A-A in FIG. 2.

Some modes of carrying out the invention are described below as preferred embodiments with reference to the accompanied drawings. FIG. 1 is a sectional view schematically showing the configuration of a plasma processing apparatus 10 including a wafer support device 20 in a first embodiment of the invention. FIG. 2 is a partial sectional view of the wafer support device 20. FIG. 3 is a sectional view of the wafer support device 20, taken on the line A-A in FIG. 2.

In the plasma processing apparatus 10, the wafer support device 20 and an upper electrode 60 used for plasma generation are placed in a vacuum chamber 12 with the internal pressure adjustable function that is made of a metal (for example, an aluminum alloy) as shown in FIG. 1. The upper electrode 60 has a large number of small holes 60a for supplying a reactive gas to each wafer surface.

The vacuum chamber 12 is designed to introduce the reactive gas from a reactive gas supply conduit 14 onto the upper electrode 60 and to reduce the internal pressure to a preset degree of vacuum by means of a vacuum pump connected to an exhaust conduit 16.

The wafer support device 20 has an electrostatic chuck 22 provided to attract a silicon wafer W for plasma processing, a protection ring 30 placed on a step 26 of the electrostatic chuck 22, a cooling plate 40 located on the rear face of the electrostatic chuck 22 to cool down the electrostatic chuck 22, and a coolant gas flow path 50 arranged to make a flow of coolant gas for cooling down the protection ring 30.

The electrostatic chuck 22 is a ceramic component and includes a circular wafer mount surface 24 on which the wafer W is placed and the step 26 formed on the outer circumference of the wafer mount surface 24 to have a height lower than that of the wafer mount surface 24. A meshed internal electrode 28 is embedded in the electrostatic chuck 22 to allow application of a direct-current voltage. The wafer mount surface 24 is formed to have a smaller diameter than the diameter of the wafer W. The circumferential edge of the wafer W placed on the wafer mount surface 24 is accordingly protruded from the wafer mount surface 24. Applying a direct-current voltage to the internal electrode 28 attracts and fixes the wafer W onto the wafer mount surface 24 by the Coulomb force or the Johnson-Rahbek force. Removal of the applied direct-current voltage releases the adsorption and fixation of the wafer W onto the wafer mount surface 24.

The protection ring 30 is, for example, a metal silicon member and includes a ring body 32 placed on the step 26 of the electrostatic chuck 22 and a skirt 34 extended downward from the rear face of the ring body 32. The ring body 32 is designed to have a slightly greater inner diameter than the diameter of the wafer mount face 24. The ring body 32 has a groove 32a (see FIG. 2) formed along the inner circumference on its top face to prevent the ring body 32 from coming into contact with the side face or the bottom face of the wafer W placed on the wafer mount surface 24. There is a gap in the unit of microns formed by irregularities due to the surface roughness of the ring body 32 and the step 26. The skirt 34 has a cylindrical shape and is formed to have a slightly greater inner diameter than the diameter of the step 26 of the electrostatic chuck 22. The inner wall of the skirt 34 is thus slightly away from the side face of the electrostatic chuck 22. The skirt 34 is formed to cover part of the side face of a cold plate body 42 of the cooling plate 40. The protection ring 30 works to protect the side faces of the wafer W and the electrostatic chuck 22. The protection ring 30 is not bonded to the step 26 of the electrostatic chuck 22 but is simply placed on the step 26. In the case of plasma etching as the plasma processing, the material of the protection ring 30 is adequately selected according to the type of an etching target membrane of the wafer W.

The cooling plate 40 is a metal member (made of, for example, aluminum or an aluminum alloy) and includes the cylindrical cold plate body 42 and a flange 44 extended radially outward from the lower end of the cold plate body 42. The cold plate body 42 has an identical diameter with the diameter of the step 26 of the electrostatic chuck 22. The cold plate body 42 has a top face that is stuck to a bottom face of the electrostatic chuck 22 by means of a resin adhesive sheet 47. The adhesive sheet 47 has a smaller diameter than the diameters of the cold plate body 42 and of the step 26 of the electrostatic chuck 22. An outer circumferential area 48 of the adhesive sheet 47 forms a clearance or space between the cold plate body 42 and the electrostatic chuck 22 (see FIGS. 2 and 3). The cold plate body 42 has a refrigerant conduit 46, through which a refrigerant cooled by an external cooling device (not shown) is circulated. The temperature of the wafer W is controllable via the electrostatic chuck 22 by adjusting the temperature and the flow rate of the refrigerant circulating through the refrigerant conduit 446. The flange 44 is fixed to a bottom face of the vacuum chamber 12 by means of bolts 49. The whole wafer support device 20 is accordingly fastened inside the vacuum chamber 12.

The coolant gas flow path 50 is arranged to make a flow of coolant gas (for example, helium gas) for cooling down the protection ring 30 as shown by the solid arrows in FIGS. 2 and 3. The coolant gas flow path 50 includes first flow paths 51 that are extended from the outside of the vacuum chamber 12 and are formed about the outer circumference of the horizontal refrigerant conduit 46 to pass through the cooling plate 40 in a vertical direction and to be open to the outer circumferential area 48 of the adhesive sheet 47, and a second flow path 52 that is extended from the first flow paths 51 through the outer circumferential area 48 of the adhesive sheet 47 to the whole circumference of the inner wall of the skirt 34 of the protection ring 30. The second flow path 52 is substantially equal to the outer circumferential area 48.

The upper electrode 60 is placed above and away from the wafer mount surface 24 of the electrostatic chuck 22. A high-frequency power source (not shown) is connected between the upper electrode 60 and the internal electrode 28 of the electrostatic chuck 22. A high-frequency power is supplied from the high-frequency power source during plasma generation of the reactive gas.

The following describes an application of the plasma processing apparatus 10 having the structure discussed above. The refrigerant cooled down to a preset temperature (for examples 25° C.) by the external cooling device (not shown) is circulated through the refrigerant conduit 46. The wafer W is placed on the wafer mount surface 24 of the electrostatic chuck 22. The vacuum chamber 12 is depressurized to the preset degree of vacuum by the vacuum pump. A direct-current voltage is then applied to the internal electrode 28 of the electrostatic chuck 22 to produce the Coulomb force or the Johnson-Rahbek force and accordingly attract and fix the wafer W onto the wafer mount surface 24 of the electrostatic chuck 22. The vacuum chamber 12 is then made in a reactive gas atmosphere of a specified pressure (for example, several ten to several hundred Pa). In this state, a preset flow rate (for example, several to several ten cc/min) of helium gas is introduced as the coolant gas to be flowed through the coolant gas flow path 50. The helium gas is spread over to collide against the whole circumference on the inner wall of the skirt 34 of the protection ring 30 as shown by the solid arrows in FIGS. 2 and 3. The helium gas then moves downward to go through the space between the protection ring 30 and the side face of the cooling plate 40 and flows out of the wafer support device 20. The helium gas also moves upward to go through the space between the protection ring 30 and the side face of the step 26 of the electrostatic chuck 22 and the very narrow micron gap between the protection ring 30 and the step 26 of the electrostatic chuck 22 and flows out of the wafer support device 20. In this state, a high-frequency voltage is applied between the upper electrode 60 and the internal electrode 28 of the electrostatic chuck 22 in the vacuum chamber 12 to generate plasma. The surface of the wafer W is etched by the generated plasma. Here, both a direct-current voltage and a high-frequency voltage are applied to the internal electrode 28 to generate electrostatic force. A high-frequency voltage can be applied to a cooling plate instead of the internal electrode 28.

In the structure of this embodiment described above, the flow of helium gas is spread over from the electrostatic chuck 22 to collide against the whole circumference on the inner wall of the skirt 34 of the protection ring 30. The flow of helium gas against the skirt 34, however, generates substantially no force in a direction of lifting up the protection ring 30 from the step 26. The structure of this embodiment is thus free from the potential troubles and failures caused by the lift-up of the protection ring 30. These potential troubles and failures include, for example, the particulate generation or damage of the protection ring 30 caused by collision of the protection ring 30 shifting from its fixed position with the wafer W or another component and the difficulty in release of heat from the protection ring 30 to the electrostatic chuck 22. The spread of helium gas over the whole circumference of the skirt 34 substantially uniformly cools down the whole protection ring 30. There is a low potential for arcing since the skirt 34 is sufficiently apart from the plasma generation area. The arrangement of the embodiment thus sufficiently cools dozen the protection ring 30 while effectively preventing the lift-up and damage of the protection ring 30.

The coolant gas flow path 50 is not formed inside the ceramic electrostatic chuck 22 but is defined by utilizing the inside of the metal cooling plate 40 and the space between the cooling plate 40 and the electrostatic chuck 22. This arrangement ensures relatively easy production of the coolant gas flow path 50. The protection ring 30 with the skirt 34 has a large contact area with the coolant gas and a high thermal capacity and thus does not easily increase in temperature.

Second Embodiment

Figure 4:
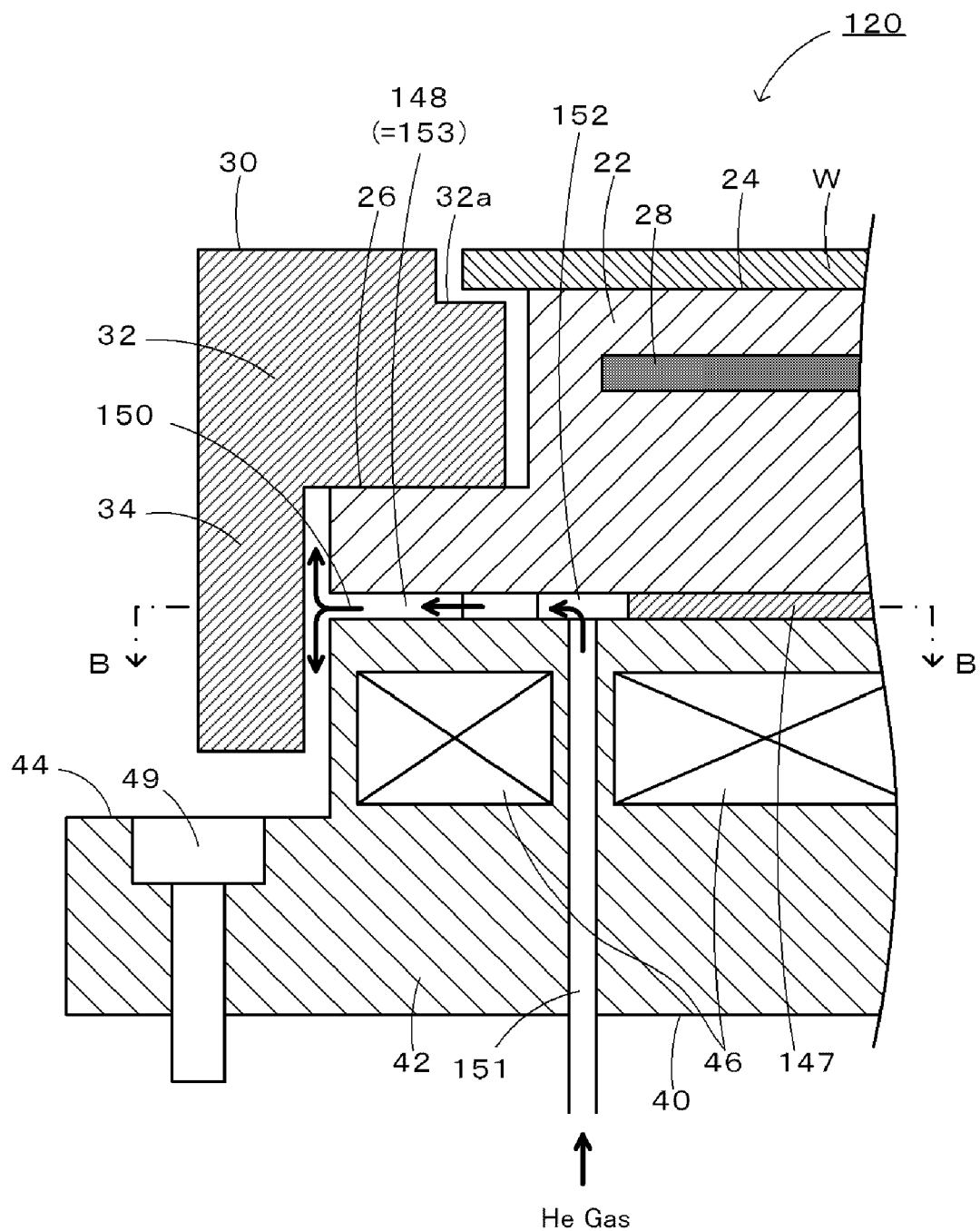
FIG. 4 is a partial sectional view of the wafer support device 120.
Figure 5:
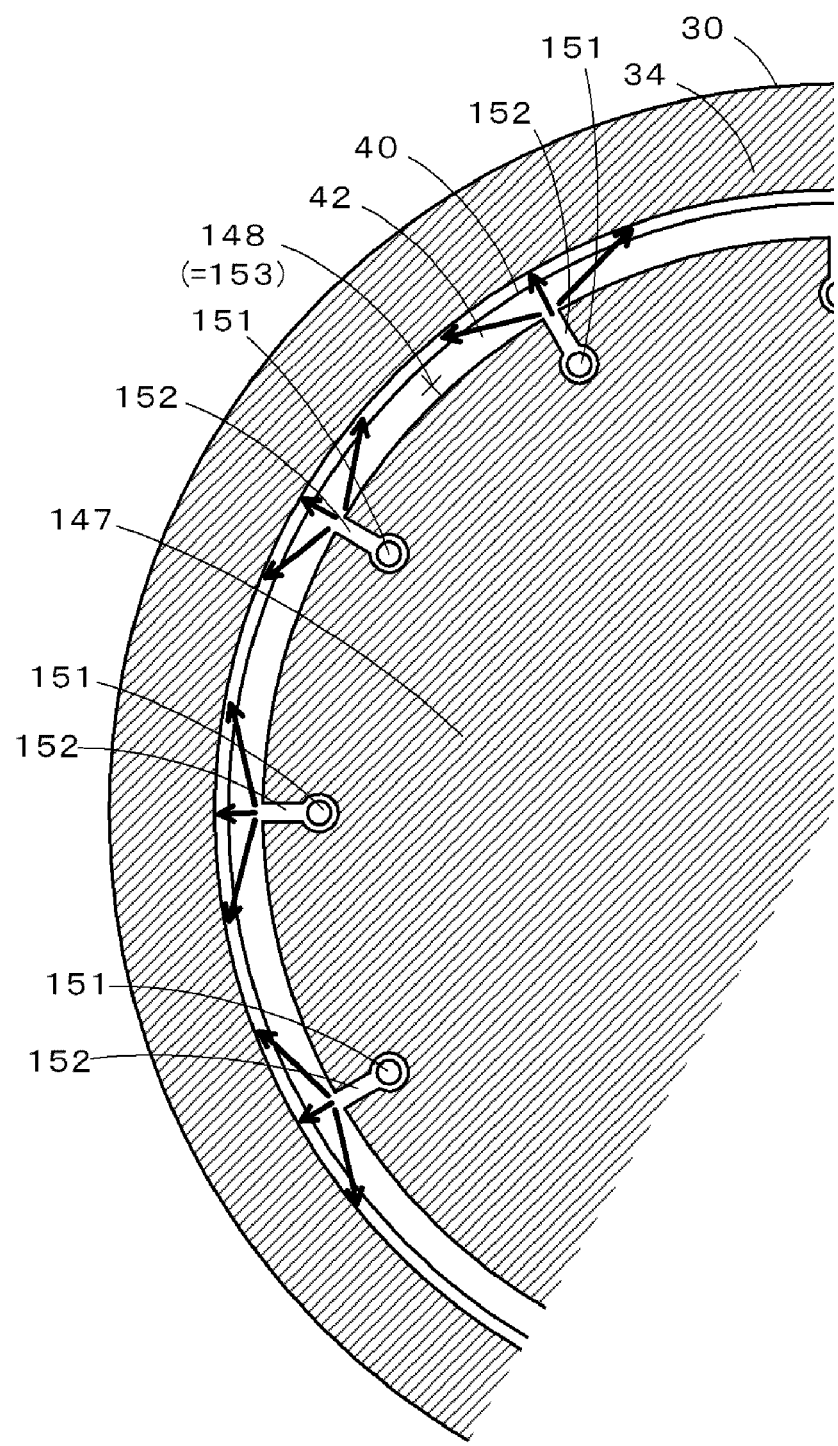
FIG. 5 is a sectional view of the wafer support device 120, taken on the line B-B in FIG. 4.

A wafer support device 120 is described below as a second embodiment of the invention. The wafer support device 120 of the second embodiment has structure similar to the structure of the wafer support device 20 of the first embodiment discussed above, except formation of a coolant gas flow path 150. The like components and elements of the second embodiment to those of the first embodiment are expressed by the like numerals and are not specifically described here. FIG. 4 is a partial sectional view of the wafer support device 120. FIG. 5 is a sectional view of the wafer support device 120, taken on the line B-B in FIG. 4.

In the wafer support device 120 of the second embodiment, the coolant gas flow path 150 is arranged to make a flow of helium gas as the coolant gas for cooling down the protection ring 30 as shown by the solid arrows in FIGS. 4 and 5. The coolant gas flow path 150 includes first flow paths 151 that are formed to pass through the horizontal refrigerant conduit 46 and the cooling plate 40 in a vertical direction, keyhole-shaped second flow paths 152 that communicate with the first flow paths 151 and are formed on the outer circumference of an adhesive sheet 147, and a third flow path 153 that is substantially equal to an outer circumferential area 148 communicating with the second flow paths 152. As shown in FIG. 5, each of the second flow paths 152 has a circular hole formed in the adhesive sheet 147 and a slit cut outward in the radial direction from the circular hole. The coolant gas flowing through the coolant gas flow path 150 of this structure collides against the whole circumference on the inner wall of the skirt 34 of the protection ring 30 as shown in FIG. 5.

The structure of the second embodiment has the following additional effects, as well as the effects similar to those of the first embodiment discussed previously. The vertically-running first flow paths 151 are formed to pass through the horizontal refrigerant conduit 46, so that the coolant gas flowing through the first flow paths 151 is sufficiently cooled down by the refrigerant flowing through the refrigerant conduit 46. The refrigerant conduit 46 is extended to a specific position close to the outer circumferential edge of the cooling plate 40. This structure more efficiently cools down the outer circumferential side face of the cooling plate 40 by the refrigerant and thus sufficiently lowers the temperature of the coolant gas flowing through the space between the outer circumferential side face of the cooling plate 40 and the skirt 34 of the protection ring 30. The structure of the second embodiment thus more effectively cools down the protection ring 30, compared with the structure of the first embodiment.

[Other Aspects]

Figure 6:
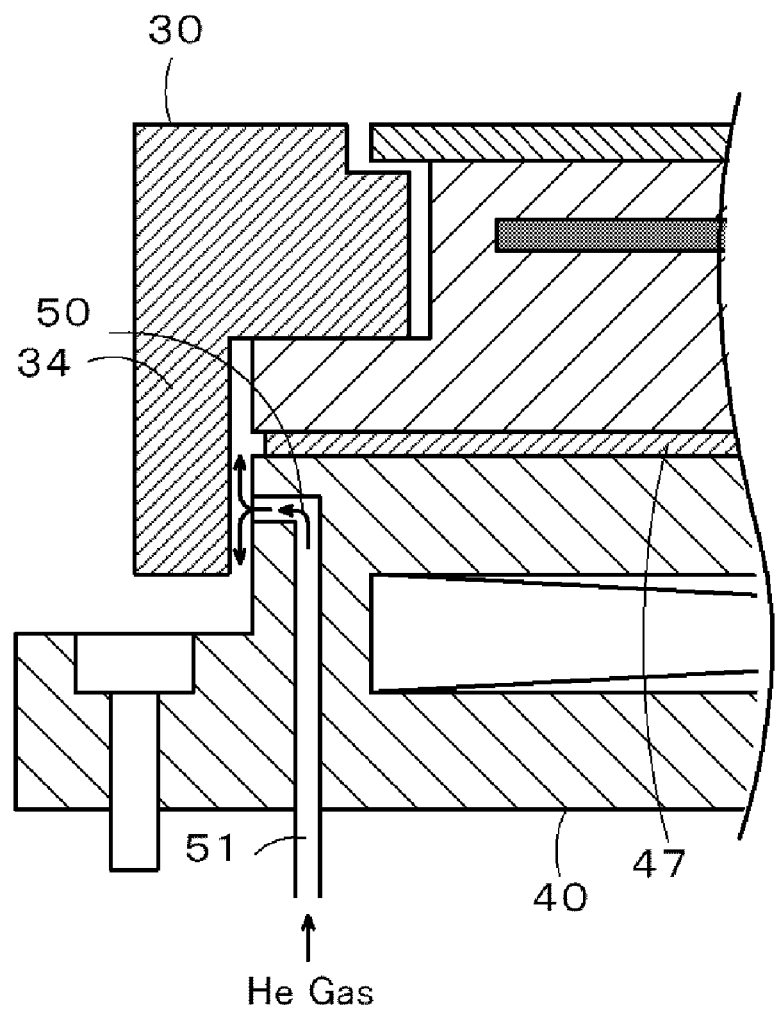
FIG. 6 is a partial sectional view of a wafer support device 20 of one modified structure.
Figure 7:
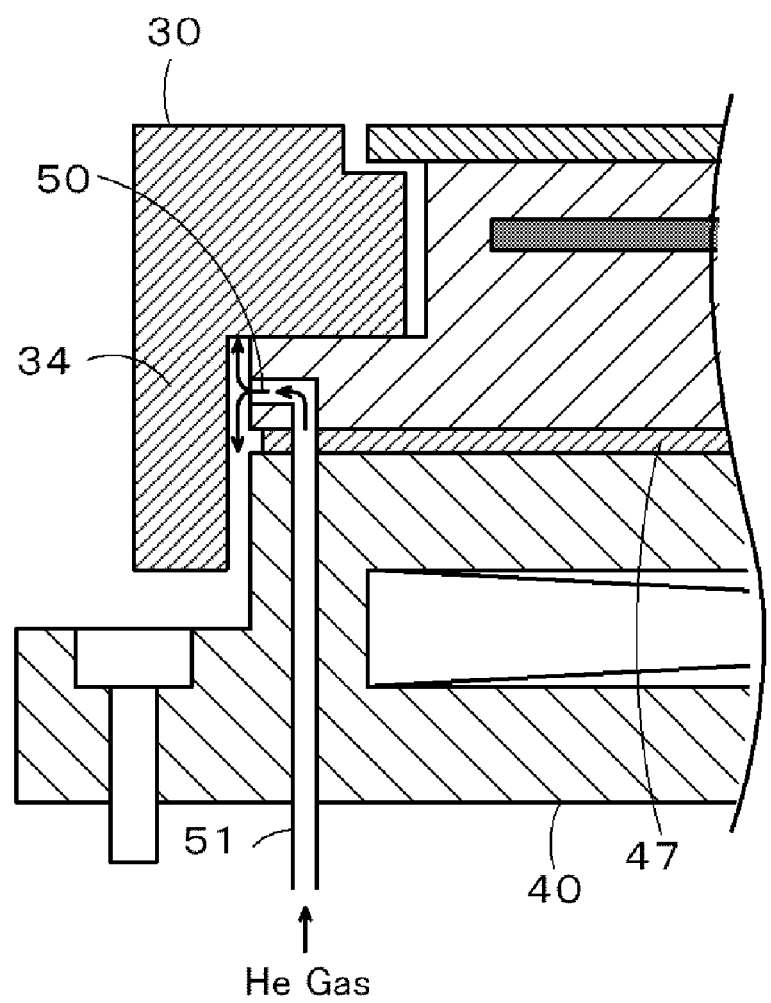
FIG. 7 is a partial sectional view of a wafer support device 20 of another modified structure.

In the structure of the first embodiment, the coolant gas is flowed through the space (outer circumferential area 48) between the cooling plate 40 and the electrostatic chuck 22 to collide against the inner wall of the skirt 34 of the protection ring 30. The structure of the first embodiment may be modified as shown in FIG. 6 or FIG. 7. In one modified structure of FIG. 6, the first flow paths 51 of the coolant gas flow path 50 are bent at 90 degrees to be open to the side face of the cooling plate 40. The coolant gas flows out of these openings of the cooling plate 40 to collide against the inner wall of the skirt 34 of the protection ring 30. In another modified structure of FIG. 7, the first flow paths 51 of the coolant gas flow path 50 pass through the adhesive sheet 47 to be extended to the inside of the electrostatic chuck 22 and are then bent at 90 degrees to be open to the side face of the electrostatic chuck 22. The coolant gas flows out of these openings of the electrostatic chuck 22 to collide against the inner wall of the skirt 34 of the protection ring 30. The coolant gas flow paths of these modified examples basically have the similar effects to those of the first and the second embodiments, although requiring more labor and time for manufacturing than the coolant gas flow paths 50 and 150 of the first and the second embodiments. In the structures of the first and the second embodiments, the coolant gas is spread over the outer circumferential area 48 or 148 and subsequently collides with the inner wall of the skirt 34 of the protection ring 30. The structures of the first and the second embodiments thus ensure the more homogeneous spread and flow of the coolant gas over the wider area and enable the cooling plate 40 to more effectively remove the heat from the protection ring via the flow of the coolant gas, compared with the modified structures of FIGS. 6 and 7.

In the wafer support devices 20 and 120 of the first and the second embodiments, helium gas is used as the coolant gas. The coolant gas is, however, not restricted to helium gas but may be any gas inactive during the plasma processing of the wafer W. The helium gas has the high thermal conductivity and is thus advantageous.

In the wafer support devices 20 and 120 of the first and the second embodiments, the coolant gas flow paths 50 and 150 are arranged to make the coolant gas collide at substantially right angles against the inner wall of the skirt 34 of the protection ring 30. The coolant gas flow path may alternatively be arranged to make the coolant gas collide obliquely upward or obliquely downward against the inner wall of the skirt 34 of the protection ring 30.

In the wafer support devices 20 and 120 of the first and the second embodiments, the protection ring 30 has the groove 39a formed on the top face thereof. The groove 32a may be omitted as long as the protection ring 30 does not interfere with the wafer W placed on the wafer mount surface 24.

EXAMPLES

Working Example 1

A wafer support device of Working Example 1 having the structure corresponding to the wafer support device 20 of the first embodiment was manufactured according to the procedure discussed below. The electrostatic chuck 22 was provided first. The procedure uniaxially molded aluminum nitride powder to an object of 5 mm in thickness and 380 mm in diameter, placed the molybdenum meshed internal electrode 28 (292 mm in diameter) on the molded object, added aluminum nitride powder on the internal electrode 28 in a mold, and formed a molded component of 25 mm as the whole thickness. The molded component was set with a graphite jig in a uniaxial hot press firing furnace and was fired under pressure of 1 ton in a nitrogen atmosphere at 1850° C. for 2 hours to obtain a sintered body with the internal electrode 28 embedded therein. The sintered body was subjected to cutting work to give the electrostatic chuck 22 having the following dimensions. The thickness from the internal electrode 28 to the wafer mount surface 24 was 1 mm. The diameter of the wafer mount surface 24 was 298 mm. The height from the step 26 to the wafer mount surface 24 was 4 mm. The diameter of the electrostatic chuck 22 including the step 26 was 376 mm. The height from the bottom face of the electrostatic chuck 22 to the step 26 was 4 mm. The total thickness of the electrostatic chuck 22 was 8 mm. A hole was bored from the bottom face of the electrostatic chuck 22 opposite to the wafer mount surface 24 to the internal electrode 28. An electrically conductive member was set in the hole by brazing to be connected with the internal electrode 28. The electrically conductive member is omitted from the illustration of FIGS. 1 through 7.

The cooling plate 40 was made of an aluminum alloy and was formed to include the built-in refrigerant conduit 46 and have the following dimensions. The total thickness of the cooling plate 40 was 20 mm. The thickness of the flange 44 was 12 mm. The diameter of the cold plate body 42 (the diameter of the joint surface with the electrostatic chuck 22) was 376 mm. The diameter of the cooling plate 40 including the flange 44 was 416 mm. The cooling plate 40 had twelve through holes of 2 mm in diameter arranged at equal intervals on a specific PCD (pitch circle diameter) of 370 mm. These holes form the first flow paths 51 of the coolant gas flow path 50. The protection ring 30 was made of metal silicon and was formed to have the following dimensions. The outer diameter of the protection ring 30 was 385 mm. The inner diameter and the thickness of the ring body 32 were 299 mm and 4 mm, respectively. The inner diameter and the height of the skirt 34 were 377 mm and 12 mm, respectively. The protection ring 30 shown in FIGS. 1 and 2 has the groove 32a. In Working Example 1, the outer diameter and the depth of the groove 32a were 301 mm and 1.2 mm, respectively. The adhesive sheet 47 was made of silicone resin and was formed to have the outer diameter of 364 mm and the thickness of 0.78 mm.

The cooling plate 40 was joined with the electrostatic chuck 22 by means of the adhesive sheet 47. The cooling plate 40, the adhesive sheet 47, and the electrostatic chuck 22 were coaxially arranged to be joined. This formed the ring-shaped outer circumferential area 48 (equal to the second flow path 52) having the width of 6 mm inward from the outer circumferential edge (circle of 376 mm in diameter) of the electrostatic chuck 22. The flow of the coolant gas was introduced through the twelve through holes (equal to the first flow paths 51) arranged at equal intervals on the specific PCD of 370 mm in the cooling plate 40 to the outer circumferential area 48. The rear face of the ring body 32 of the protection ring 30 was placed on the step 26 of the electrostatic chuck 22. This completed the wafer support device of Working Example 1.

Working Example 2

A wafer support device of Working Example 2 having the structure corresponding to the wafer support device 120 of the second embodiment was manufactured according to the procedure discussed below. The electrostatic chuck 22 and the protection ring 30 of Working Example 2 were identical with those of Working Example 1. The cooling plate 40 was made of an aluminum alloy and was formed to include the built-in refrigerant conduit 46 and have the following dimensions. The total thickness of the cooling plate 40 was 20 mm. The diameter of the cold plate body 42 (the diameter of the joint surface with the electrostatic chuck 22) was 376 mm. The diameter of the cooling plate 40 including the flange 44 was 416 mm. The cooling plate 40 had twelve through holes of 2 mm in diameter arranged at equal intervals on a specific PCD of 288 mm. These holes form the first flow paths 151 of the coolant gas flow path 150. The adhesive sheet 147 was made of silicone resin and was formed to have the outer diameter of 364 mm and the thickness of 0.78 mm. The adhesive sheet 147 had twelve circular holes of 3 mm in diameter arranged at equal intervals at the specific PCD of 288 mm and twelve slits cut outward in the radial direction from the respective circular holes. The circular holes and the slits form the keyhole-shaped second flow paths 152 of the coolant gas flow path 150.

The cooling plate 40 was joined with the electrostatic chuck 22 by means of the adhesive sheet 147. Each of the twelve through holes of the cooling plate 40 was aligned with the corresponding one of the twelve circular holes of the adhesive sheet 147 in this joining step. This formed the ring-shaped outer circumferential area 148 (equal to the third flow path 153), which was similar to the outer circumferential area 48 of Working Example 1. The flow of the coolant gas was introduced through the twelve through holes (equal to the first flow paths 151) arranged at equal intervals on the specific PCD of 280 mm in the cooling plate 40 and the twelve keyhole-shaped second flow paths 152 in the adhesive sheet 147 to the outer circumferential area 148. The rear face of the ring body 32 of the protection ring 30 was placed on the step 26 of the electrostatic chuck 22. This completed the wafer support device of Working Example 2.

Comparative Example 1

Figure 8:
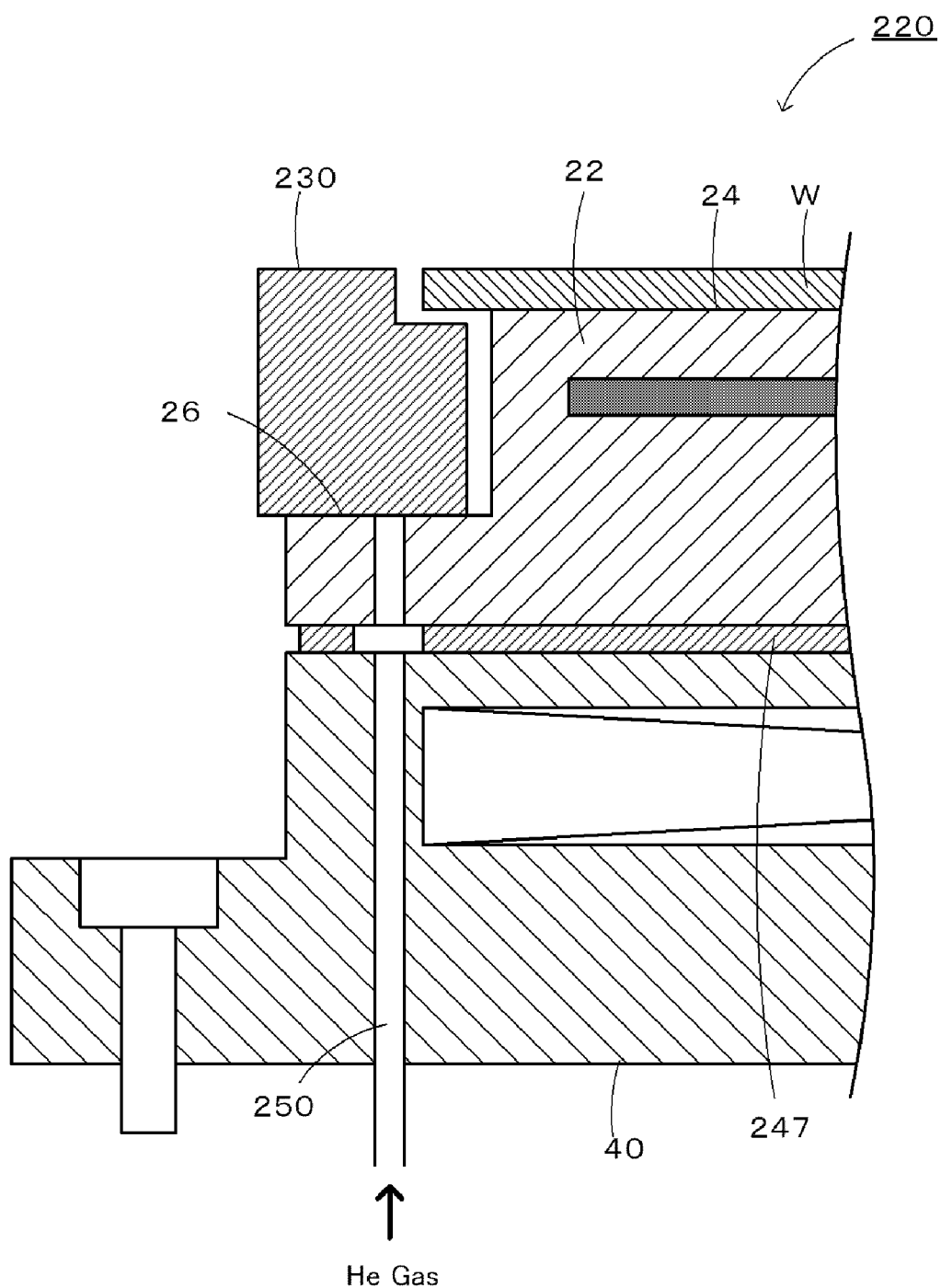
FIG. 8 is a partial sectional view of a conventional wafer support device 220.

A wafer support device of Comparative Example 1 having the structure corresponding to the wafer support device 220 shown in FIG. 8 was manufactured according to the procedure discussed below. The electrostatic chuck 22 and the cooling plate 40 of Comparative Example 1 had the same dimensions as those of Working Example 1. The electrostatic chuck 22 further had twelve through holes of 2 mm in diameter formed in parallel with its thickness and arranged at equal intervals on a specific PCD of 337 mm. An adhesive sheet 247 had the same dimensions as those of Working Example 1: the outer diameter of 364 mm and the thickness of 0.78 mm. The adhesive sheet 247 further had twelve through holes of 3 mm in diameter arranged at equal intervals on the specific PCD of 337 mm. The protection ring 230 was made of metal silicon and was formed to have the outer diameter of 377 mm, the inner diameter of 299 mm, and the thickness of 5 mm. The protection ring 230 shown in FIG. 8 has a groove formed along the inner circumference on its top face. In Comparative Example 1, the outer diameter and the depth of the groove were 301 mm and 1.2 mm, respectively.

The cooling plate 40 was joined with the electrostatic chuck 22 by means of the adhesive sheet 247. Each of the twelve through holes of the cooling plate 40 was aligned with the corresponding one of the twelve through holes formed in the adhesive sheet 247 and with the corresponding one of the twelve through holes formed in the electrostatic chuck 22 in this joining step. This formed the coolant gas flow path 250. The flow of the coolant gas was introduced through the coolant gas flow path 250 to collide against the rear face of the protection ring 230. The protection ring 230 was placed on the step 26 of the electrostatic chuck 22. This completed the wafer support device of Comparative Example 1.

[Evaluation Test 1]

Figure 9:
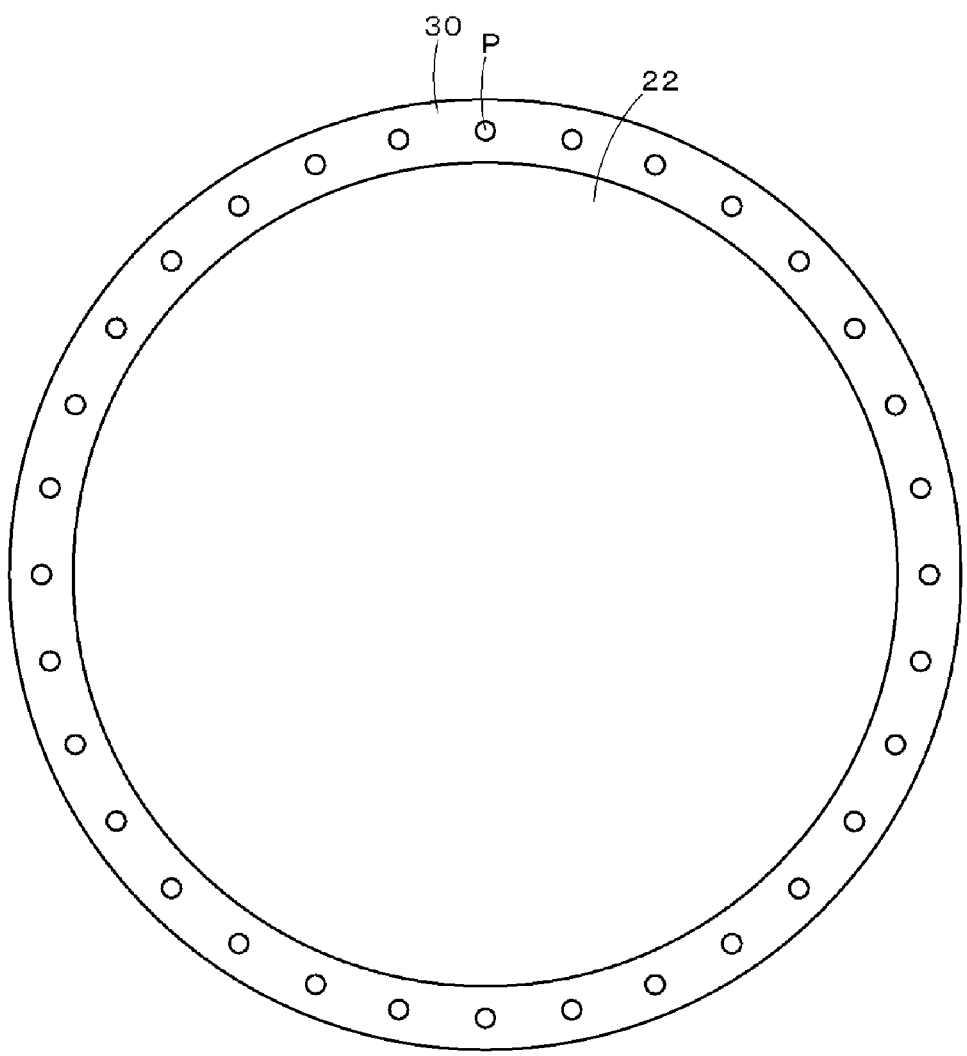
FIG. 9 is a plan view of a protection ring 30 applied on the surface of temperature patches P.

The wafer support device of Working Example 1 was set in the vacuum chamber 12 as shown in FIG. 1. The flange 44 of the cooling plate 40 was fixed to the vacuum chamber 12 across a gas distribution block (not shown) by means of the bolts 49. Piping for the coolant gas running from the outside of the vacuum chamber 12 was connected to the gas distribution block. The flow of the coolant gas introduced via the gas distribution block was equally distributed into the twelve through holes (equal to the first flow paths 51) formed in the cooling plate 40. A refrigeration line (not shown) was attached to the cooling plate 40 to make the flow of the refrigerant through the refrigerant conduit 46 in the cooling plate 40. The flow of the refrigerant was controlled to keep a constant temperature of 25° C. by an external cooling device. A high voltage cable was attached to an electrode terminal connected with the electrically conductive member of the electrostatic chuck 22 to apply a direct-current voltage. In this state, a silicon wafer W (having the diameter of 300 mm and the thickness of 1.5 mm) was placed on the wafer mount surface 24 of the electrostatic chuck 22. After the vacuum chamber 12 was evacuated, a direct-current voltage of 700 V was applied to the internal electrode 28 of the electrostatic chuck 22 to generate the electrostatic force and attract the wafer W. The vacuum chamber 12 was set in an argon atmosphere of 20 Pa, and the 6 sccm flow rate of helium gas as the coolant gas was introduced through the coolant gas flow path 50. In this state, a high frequency voltage of 13.56 MHz and 1200 W was applied between the upper electrode 60 in the vacuum chamber 12 and the internal electrode 28 of the electrostatic chuck 22 to generate plasma for 5 minutes. Temperature patches P were applied in advance at predetermined multiple locations on the surface of the protection ring 30 exposed to the plasma (see FIG. 9) to measure a temperature distribution. The temperature patch P changes the color when the temperature exceeds a preset reference temperature level. The color change of the temperature patch P accordingly shows a temperature increase to the preset reference temperature level. This temperature measurement was performed multiple times with several different temperature patches P of different reference temperature levels. The temperature at each location on the protection ring 30 was measured according to the color change of the temperature patch P. The temperature at each location on the protection ring 30 or 230 was also measured in the same manner in the wafer support device of Working Example 2 and in the wafer support device of Comparative Example 1. The results of the temperature measurement are shown in Table 1. The average temperature represents a mean value of the observed temperatures at the respective locations. The temperature distribution represents a difference between a highest temperature and a lowest temperature among all the observed temperatures at the respective locations.

TABLE 1

|  | Average temperature (° C.) | Temperature distribution (° C.) |
|---|---|---|
| Working Example 1 | 52 | 2 |
| Working Example 2 | 47 | 1 |
| Comparative Example 1 | 69 | 9 |

According to the results of Table 1, the average temperatures of the protection rings 30 in Working Example 1 and Working Example 2 were lower by 17 to 22° C. than the average temperature of the protection ring 230 in Comparative Example 1. The temperature distribution was 90° C. in Comparative Example 1, while being not greater than 2° C. in Working Examples 1 and 2. These results prove that the protection ring 30 is more efficiently cooled down in Working Examples 1 and 2. In the structure of Comparative Example 1, the flow of the coolant gas directly collides against the rear face of the protection ring 230. A specific area directly exposed to the flow of the coolant gas has the low temperature, while an area away from the specific area has the relatively high temperature. This causes a large temperature distribution. In the structures of Working Examples 1 and 2, on the other hand, the flow of the coolant gas collides against the whole circumference of the skirt of the protection ring 30. This causes a small temperature distribution. The wafer support devices of Working Examples 1 and 2 keep the temperature homogeneity of the wafer W and thus improve the yield of the etching process.

According to the comparison between Working Example 1 and Working Example 2, the average temperature of Working Example 2 was lower by 5° C. than the average temperature of Working Example 1. The through holes (the first flow paths 151) of Working Example 2 are formed slightly inward to be closer to the center, compared with the through holes (the first flow paths 51) of Working Example 1. In the structure of Working Example 2, the coolant gas accordingly flows close to the refrigerant conduit 46 in the cooling plate 40 to be subjected to refrigeration and then cools down the protection ring 30. Namely the structure of Working Example 2 has the higher cooling efficiency. It is preferable to form the through holes for introduction of the coolant gas in a range of 30 to 60 mm inward from the outer circumference of the cooling plate 40. The inward position of not less than 30 mm is desired for refrigeration of the coolant gas by the refrigerant. The inward position of even over 60 mm has no improved effect. The inward position of not greater than 60 mm is thus desired for easy production of the adhesive sheet.

[Evaluation Test 2]

After the wafer support device of Working Example 1 was set in the vacuum chamber 12, the vacuum chamber 12 was evacuated to 1 Pa. In this state, varying sccm flow rates of helium gas were introduced as the coolant gas via a mass flow meter. The presence or absence of any lift-up motion of the protection ring 30 was detected by observation through a window (not shown) provided on the side face of the vacuum chamber 12. Similarly the presence or absence of any lift-up motion of the protection ring 30 or the protection ring 230 was detected by observation in the wafer support device of Working Example 2 and in the wafer support device of Comparative Example 1. The results of the observation are shown in Table 2. According to the results of Table 2, there was a lift-up of the protection ring 230 at the 20 sccm or higher flow rate of helium gas in the wafer support device of Comparative Example 1. On the other hand, there was no lift-up of the protection ring 30 even at the 100 sccm flow rate of helium gas in the wafer support devices of Working Example 1 and Working Example 2. In the wafer support device of Comparative Example 1, the flow of helium gas collides against the rear face of the protection ring 230 to lift up the protection ring 230. In the wafer support devices of Working Examples 1 and 2, however, the flow of helium gas is spread over after collision against the inner wall of the skirt 34 of the protection ring 30 and accordingly does not produce the force of lifting up the protection ring 30. Namely the wafer support devices of Working Examples 1 and 2 stably keep the position of the protection ring 30 and allow introduction of the higher flow rate of the coolant gas, thus more effectively controlling a temperature increase of the protection ring 30, compared with the wafer support device of Comparative Example 1.

TABLE 2

|  | Flow rate of helium gas (SCCM) | | | | |
|---|---|---|---|---|---|
|  | 6 | 10 | 20 | 40 | 100 |
| Working Example 1 | No Lifted Up | No Lifted Up | No Lifted Up | No Lifted Up | No Lifted Up |

TABLE 2-continued

| | Flow rate of helium gas (SCCM) | | | | |
|---|---|---|---|---|---|
| | 6 | 10 | 20 | 40 | 100 |
| Working Example 2 | No Lifted Up | No Lifted Up | No Lifted Up | No Lifted Up | No Lifted Up |
| Comparative Example 1 | No Lifted Up | No Lifted Up | Lifted Up | Lifted Up | Lifted Up |

No Lifted Up: Lift-up motion of protection ring was present
Lifted Up: Lift-up motion of protection ring was absent

[Evaluation Test 3]

After the wafer support device of Working Example 1 was set in the vacuum chamber 12, the vacuum chamber 12 was evacuated to 1 Pa. While 6 sccm flow rate of helium gas was introduced as the coolant gas, the internal gas pressure of the vacuum chamber 12 was adjusted to 10 Pa. Varying outputs of a high-frequency voltage (13.56 MHz) were then applied between the internal electrode 28 of the electrostatic chuck 22 and the upper electrode 60 in the vacuum chamber 12 to generate plasma for 5 minutes. A specific area of the protection ring 30 exposed to the coolant gas was then visually observed to check for any damage caused by, for example, arcing. Similarly a corresponding specific area of the protection ring 30 or the protection ring 230 was visually observed to check for any damage caused by, for example, arcing in the wafer support device of Working Example 2 and in the wafer support device of Comparative Example 1. The results of the visual observation are shown in Table 3. According to the results of Table 3, there was a damage caused by, for example, arcing at the plasma output of 1800 W in the wafer support device of Comparative Example 1. On the other hand, there was no damage caused by, for example, arcing even at the plasma output of 3000 W in the wafer support devices of Working Example 1 and Working Example 2. The wafer support devices of Working Examples 1 and 2 do not cause any damage caused by, for example, arcing on the surface of the protection ring 30 and thus ensure the stable etching process for a long time period.

TABLE 3

| | High-frequency voltage (W) | | | | |
|---|---|---|---|---|---|
| | 1200 | 1500 | 1800 | 2200 | 3000 |
| Working Example 1 | No Damaged | No Damaged | No Damaged | No Damaged | No Damaged |
| Working Example 2 | No Damaged | No Damaged | No Damaged | No Damaged | No Damaged |
| Comparative Example 1 | No Damaged | No Damaged | Damaged | Damaged | Damaged |

No Damaged: No damage was observed in protection ring
Damaged: Damage was observed in protection ring It is to be understood that the present invention is not limited to the embodiment described above, and various embodiments within the scope of the technical field of the present invention can be carried out.

The present application claims the benefit of the priority from U.S. Patent Application No. 61/077,602 filed on Jul. 2, 2008, the entire contents of which are incorporated herein by reference.

What is claimed is:

1. A wafer support device comprising:
   an electrostatic chuck structured to have a wafer mount surface that a wafer is placed on and an internal electrode and configured to make the wafer attract onto the wafer mount surface under application of a direct-current voltage to the internal electrode;
   a step formed around an outer circumference of the wafer mount surface in the electrostatic chuck to have a height lower than the wafer mount surface;
   a protection ring placed on the step of the electrostatic chunk and having a skirt covering over a side face of the electrostatic chuck; and
   a coolant gas flow path formed to make a coolant gas spread over from a side of the electrostatic chuck and collide against a whole circumference on an inner wall of the skirt of the protection ring.

2. The wafer support device in accordance with claim 1, the wafer support device further having:
   a cooling plate joined with a face of the electrostatic chuck opposite to the wafer mount surface across an adhesive layer and provided to cool down the electrostatic chuck,
   wherein the coolant gas flow path is formed to make the coolant gas spread over from inside of the cooling plate and collide against the whole circumference on the inner wall of the skirt of the protection ring via an outer circumferential area of the adhesive layer in a space between the cooling plate and the electrostatic chuck.

3. The wafer support device in accordance with claim 2, wherein the coolant gas flow path is formed to make the coolant gas flow from the inside of the cooling plate through a gas induction pathway formed inside the adhesive layer to the outer circumferential area of the adhesive layer to be spread over from the outer circumferential area of the adhesive layer and collide against the whole circumference on the inner wall of the skirt of the protection ring.

4. A component used for a wafer support device, the component used for the wafer support device comprising:
   an electrostatic chuck structured to have a wafer mount surface that a wafer is placed on and an internal electrode and configured to make the wafer attract onto the wafer mount surface under application of a direct-current voltage to the internal electrode;
   a step formed around an outer circumference of the wafer mount surface in the electrostatic chuck to have a height lower than the wafer mount surface and designed to place thereon a protection ring with a skirt covering over a side face of the electrostatic chuck; and
   a coolant gas flow path formed to make a coolant gas spread over from a side of the electrostatic chuck and collide against a whole circumference on an inner wall of the skirt of the protection ring.

5. The component used for the wafer support device in accordance with claim 4, the component further having:
   a cooling plate joined with a face of the electrostatic chuck opposite to the wafer mount surface across an adhesive layer and provided to cool down the electrostatic chuck,
   wherein the coolant gas flow path is formed to make the coolant gas spread over from inside of the cooling plate and collide against the whole circumference on the inner wall of the skirt of the protection ring via an outer circumferential area of the adhesive layer in a space between the cooling plate and the electrostatic chuck.

6. The component used for the wafer support device in accordance with claim 5, wherein the coolant gas flow path is formed to make the coolant gas flow from the inside of the cooling plate through a gas induction pathway formed inside the adhesive layer to the outer circumferential area of the adhesive layer to be spread over from the outer circumferential area of the adhesive layer and collide against the whole circumference on the inner wall of the skirt of the protection ring.

* * * * *